US012677638B2

(12) United States Patent
Mori

(10) Patent No.: US 12,677,638 B2
(45) Date of Patent: Jul. 7, 2026

(54) VACUUM PROCESSING APPARATUS AND TILT ADJUSTMENT METHOD

(71) Applicant: Tokyo Electron Limited, Minato-ku (JP)

(72) Inventor: Kiyoshi Mori, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 349 days.

(21) Appl. No.: 18/549,177

(22) PCT Filed: Feb. 28, 2022

(86) PCT No.: PCT/JP2022/008163
§ 371 (c)(1),
(2) Date: Sep. 6, 2023

(87) PCT Pub. No.: WO2022/190921
PCT Pub. Date: Sep. 15, 2022

(65) Prior Publication Data
US 2024/0162076 A1 May 16, 2024

(30) Foreign Application Priority Data
Mar. 12, 2021 (JP) ................................. 2021-040100

(51) Int. Cl.
H10P 72/00 (2026.01)
G05B 19/4155 (2006.01)
H10P 72/76 (2026.01)

(52) U.S. Cl.
CPC ...... H10P 72/7618 (2026.01); G05B 19/4155 (2013.01); *G05B 2219/50156* (2013.01)

(58) Field of Classification Search
CPC ......... H01L 21/68771; H01L 21/68785; H01L 21/68742; H01L 21/687; H10P 72/00; H10P 72/0604; H10P 72/13; H10P 72/15; H10P 72/1912; H10P 72/34; H10P 72/50
See application file for complete search history.

(56) References Cited

U.S. PATENT DOCUMENTS

| | | | | | |
|---|---|---|---|---|---|
| 3,783,822 | A | * | 1/1974 | Wollam | ................... C30B 25/08 |
| | | | | | 118/725 |
| 2018/0096874 | A1* | | 4/2018 | Schaller | ............ H01L 21/68742 |
| 2019/0360633 | A1* | | 11/2019 | Schaller | ............ H01L 21/68792 |

(Continued)

FOREIGN PATENT DOCUMENTS

JP        2001-230307 A        8/2001

*Primary Examiner* — Lee D Wilson
(74) *Attorney, Agent, or Firm* — Armstrong Teasdale LLP

(57) ABSTRACT

A vacuum processing apparatus includes: a processing container having top and bottom walls, a sidewall, and an interior that is kept in a vacuum atmosphere; a stage provided inside the processing container to hold a substrate placed on the stage so as to face the top wall; a support member penetrating the bottom wall to support the stage from below; a tilt changer provided at an end portion of the support member located outside the processing container to change a tilt of the stage relative to the top wall; at least one distance meter configured to measure a distance between the top wall and the stage at a measurement position on a surface of the top wall facing the stage; and a controller that controls the tilt changer to make the top wall and the stage parallel to each other based on the distance between the top wall and the stage.

15 Claims, 7 Drawing Sheets

(56) References Cited

U.S. PATENT DOCUMENTS

| | | | |
|---|---|---|---|
| 2020/0105573 A1 | 4/2020 | Schaller et al. | |
| 2020/0217657 A1 | 7/2020 | Emerson et al. | |
| 2021/0013085 A1 | 1/2021 | Roh et al. | |
| 2021/0285096 A1* | 9/2021 | Shinada | G01B 11/0625 |
| 2022/0316066 A1* | 10/2022 | Santiago | H01L 21/68764 |
| 2024/0162076 A1* | 5/2024 | Mori | H01L 21/68764 |

* cited by examiner

VACUUM PROCESSING APPARATUS AND TILT ADJUSTMENT METHOD

CROSS-REFERENCE TO RELATED APPLICATIONS

The present application is a U.S. National Stage Entry of International Patent Application No. PCT/JP2022/008163, filed Feb. 28, 2022, which claims the benefit of priority to Japanese Patent Application No. 2021-040100, filed Mar. 12, 2021, each of which is hereby incorporated herein by reference in its entirety.

TECHNICAL FIELD

The present disclosure relates to a vacuum processing apparatus and a tilt adjustment method.

BACKGROUND

Patent Document 1 below discloses a structure in which an adjustment plate for adjusting a tilt of a stage on which a substrate is placed is arranged below a bottom portion of a processing container, and the bottom portion of the processing container and the adjustment plate are fastened to each other with bolts.

PRIOR ART DOCUMENT

Patent Document

Patent Document 1: Japanese Laid-Open Patent Publication No. 2001-230307

The present disclosure provides a vacuum processing apparatus and a tilt adjustment method which are capable of suppressing a tilt of a stage with respect to a top wall of a processing container.

SUMMARY

One aspect of the disclosure is a vacuum processing apparatus including a processing container, a stage, a support member, a tilt changer, at least one distance meter, and a controller. The processing container has a top wall, a bottom wall, a sidewall, and an interior that is kept in a vacuum atmosphere. The stage is provided inside the processing container and is configured to hold a substrate placed on the stage so as to face the top wall. The support member penetrates the bottom wall of the processing container to support the stage from below. The tilt changer is provided at an end portion of the support member located outside the processing container and is configured to change a tilt of the stage with respect to the top wall of the processing container. The at least one distance meter is configured to measure a distance between the top wall and the stage at a measurement position on a surface of the top wall facing the stage. The controller is configured to control the tilt changer so as to make the top wall and the stage parallel to each other based on the distance between the top wall and the stage as measured by the at least one distance meter.

According to the present disclosure, it is possible to provide the effect of suppressing a tilt of a stage with respect to a top wall of a processing container.

BRIEF DESCRIPTION OF DRAWINGS

FIG. 1 is a schematic cross-sectional view illustrating an example of a configuration of a vacuum processing apparatus according to one embodiment.

FIG. 7 is a schematic cross-sectional view illustrating an example of a vacuum processing apparatus at an angle at which the stage blocks the laser light.

FIG. 10 is a plan view illustrating yet another example of the stage.

DETAILED DESCRIPTION

Figures 2, 3:
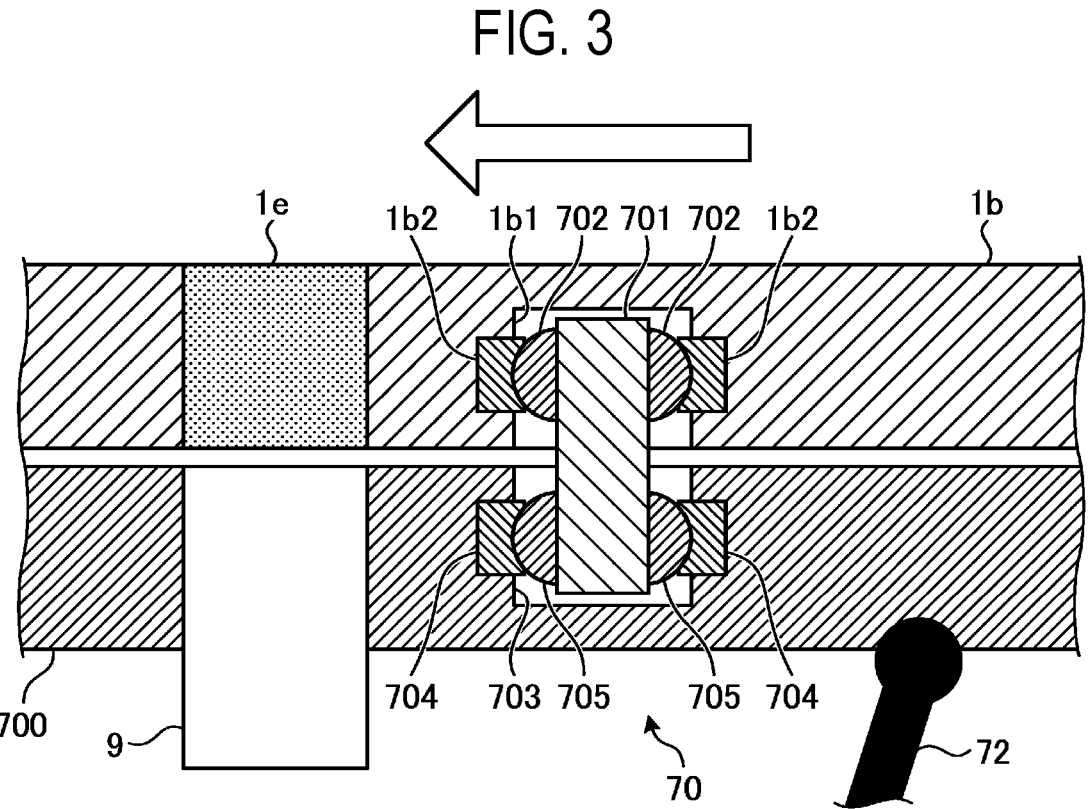
FIG. 2 is a plan view illustrating an example of a stage.
FIG. 3 is an enlarged cross-sectional view illustrating an example of a structure of an absorber.

Hereinafter, embodiments of a vacuum processing apparatus and a tilt adjustment method disclosed herein will be described in detail with reference to the drawings. In addition, the disclosed vacuum processing apparatus and tilt adjustment method are not limited to the following embodiments.

In the vacuum processing apparatus, in order to make a surface of a stage, on which a substrate is placed, parallel to a lower surface of a top wall, it is necessary to detect how much the surface of the stage, on which the substrate is placed, tilts with respect to the lower surface of the top wall. By precisely detecting the tilt of the surface of the stage on which the substrate is placed with respect to the lower surface of the top wall, it is possible to precisely calculate an adjustment amount of the tilt of the stage and to suppress the tilt of the stage with respect to the top wall.

Therefore, the present disclosure provides a technique capable of suppressing the tilt of the stage with respect to the top wall.

[Configuration of Vacuum Processing Apparatus 100]

Figure 1:
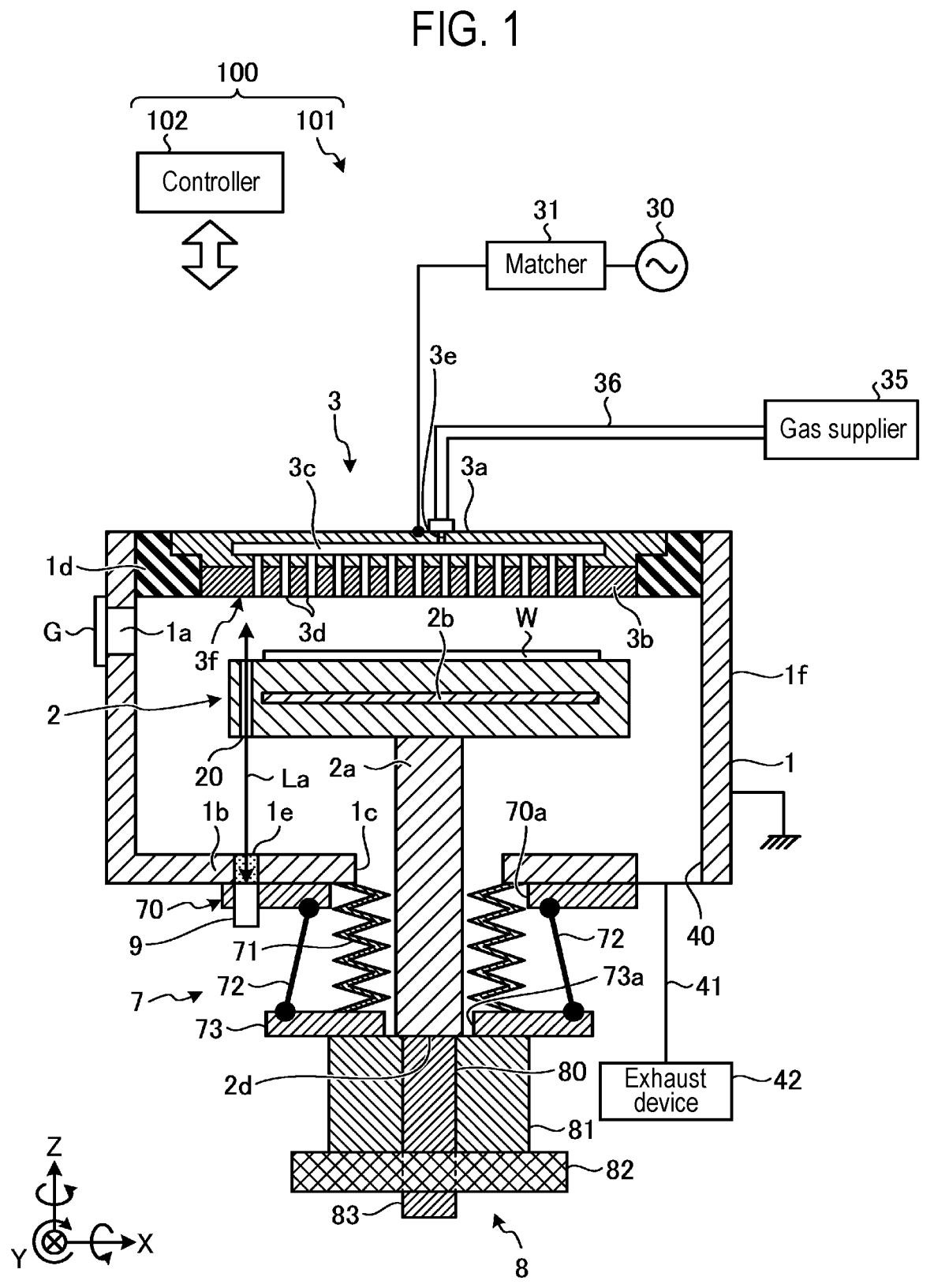

FIG. 1 is a schematic cross-sectional view illustrating an example of a configuration of a vacuum processing apparatus 100 according to one embodiment. The vacuum processing apparatus 100 illustrated in FIG. 1 is an apparatus that performs film formation under a vacuum atmosphere. For example, the vacuum processing apparatus 100 illustrated in FIG. 1 is an apparatus that performs a chemical vapor deposition (CVD) processing using plasma on a substrate W.

The vacuum processing apparatus 100 includes a processing container 1 which is formed in a substantially cylindrical shape and made of, for example, a metal such as aluminum or nickel having a surface on which an anodized film is formed. The processing container 1 has a bottom wall 1b and a sidewall 1f. The processing container 1 is grounded. The processing container 1 is air-tightly configured to have an interior kept in a vacuum atmosphere. An opening 1a for loading and unloading the substrate W therethrough is formed in the sidewall 1f of the processing container 1. The opening 1a is opened or closed by a gate valve G. The bottom wall 1b of the processing container 1 is provided with a window 1e made of a light-transmitting material such as quartz.

A stage 2 is provided inside the processing container 1. The stage 2 is formed in a flat substantially-cylindrical shape and made of, for example, a metal such as aluminum or nickel, or an aluminum nitride (AlN) in which a metal mesh electrode is embedded. The substrate W such as a semiconductor wafer, which is a processing target, is placed on an upper surface of the stage 2. In the present embodiment, in an area outside an area of the stage 2 on which the substrate W is placed, a lower surface of the stage 2 is formed parallel to the upper surface of the stage 2 on which the substrate W is placed. The stage 2 also functions as a lower electrode. The stage 2 is supported from below by a support member 2a. An opening 1c is formed in the bottom wall 1b of the processing container 1 below the stage 2. The support member 2a is formed in a substantially cylindrical shape, and extends vertically downward from the stage 2 to pass through the opening 1c in the bottom wall 1b of the processing container 1. The opening 1c is formed to have a larger diameter than that of the support member 2a.

A heater 2b is built in the stage 2. The heater 2b generates heat with power supplied from the outside of the processing container 1 and heats the substrate W placed on the stage 2. Further, although not illustrated, a flow path, through which a temperature-controlled coolant supplied by a chiller unit provided outside the processing container 1 is supplied, is formed inside the stage 2. Through the heating by the heater 2b and the cooling with the coolant supplied from the chiller unit, the stage 2 can control the substrate W at a predetermined temperature. In addition, the stage 2 may not be provided with the heater 2b but may control the temperature of the substrate W by the coolant supplied from the chiller unit.

Further, although not illustrated, an electrode is embedded in the stage 2 to generate an electrostatic force with a voltage supplied from the outside. The substrate W is adsorbed and held on the upper surface of the stage 2 by virtue of the electrostatic force generated from the electrode. Further, although not illustrated, the stage 2 is provided with lifting pins for transferring the substrate W to and from a transfer mechanism (not illustrated) provided outside the processing container 1.

Further, as illustrated in FIGS. 1 and 2, for example, a plurality of through-holes 20 are formed in the stage 2. FIG. 2 is a plan view illustrating an example of the stage 2. Each of the through-holes 20 is provided on the side of an outer periphery of the stage 2 rather than an area 2e on the stage 2 on which the substrate W is placed. Further, in the present embodiment, the plurality of through-holes 20 are arranged at regular intervals along the outer periphery of the stage 2. For example, the through-holes 20 are arranged such that an angle formed by a line segment connecting a center O of the stage 2 to each of the through-holes 20 is 120 degrees.

Returning back to FIG. 1, the description will be continued. A shower head 3, which is formed in a substantially disc shape and made of, for example, a conductive metal such as aluminum or nickel, is provided above the stage 2. A space between a lower surface of the shower head 3 and the upper surface of the stage 2 is a processing space in which a film formation processing is performed. The shower head 3 is supported above the stage 2 via an insulating member 1d such as ceramics. As a result, the processing container 1 and the shower head 3 are electrically insulated from each other. The shower head 3 constitutes a ceiling portion of the processing container 1. The shower head 3 is an example of a top wall.

The shower head 3 includes a ceiling plate 3a and a shower plate 3b. The ceiling plate 3a is provided to close the interior of the processing container 1 from above. The shower plate 3b is provided to face the stage 2 below the ceiling plate 3a. A gas diffusion chamber 3c is defined in the ceiling plate 3a. A plurality of gas discharge holes 3d which communicate with the gas diffusion chamber 3c are formed in the ceiling plate 3a and the shower plate 3b.

A gas inlet 3e for introducing a gas into the gas diffusion chamber 3c therethrough is formed in the ceiling plate 3a. A gas supplier 35 is connected to the gas inlet 3e via a pipe 36. The gas supplier 35 includes gas sources for supplying various gases used in the film formation processing, and gas supply lines connected to the respective gas sources. Each gas supply line is provided with control devices for controlling a gas flow, such as a valve and a flow controller. The gas supplier 35 supplies various gases at flow rates controlled by the control devices provided in each gas supply line, to the shower head 3 via the pipe 36. The gases supplied to the shower head 3 diffuse in the gas diffusion chamber 3c and are discharged from each gas discharge hole 3d to the processing space below the shower head 3.

Further, the shower plate 3b is paired with the stage 2 and also functions as an electrode plate for forming capacitively coupled plasma (CCP) in the processing space. A radio-frequency (RF) power supply 30 is connected to the shower head 3 via a matcher 31. The RF power supply 30 supplies RF power to the shower head 3 via the matcher 31. The RF power supplied to the shower head 3 from the RF power supply 30 is supplied from the lower surface of the shower head 3 into the processing space. The gas supplied into the processing space is plasmarized by the RF power supplied into the processing space. In addition, the RF power supply 30 may supply the RF power to the stage 2 instead of the shower head 3. In this case, the shower head 3 is grounded. Further, the RF power supply 30 may supply RF power having different frequencies and magnitudes to both the stage 2 and the shower head 3.

A lower end portion 2d of the support member 2a that supports the stage 2 is located outside the processing container 1 and is connected to a rotator 8. The rotator 8 includes a rotary shaft 80, a vacuum seal 81, and a motor 82. The lower end portion 2d of the support member 2a is connected to an upper end of the rotary shaft 80. The rotary shaft 80 is integrated with the support member 2a and rotates around an axis passing through the center O of the stage 2. A slip ring 83 is provided on a lower end portion of the rotary shaft 80. The slip ring 83 includes an electrode and is electrically connected to various wires for supplying power to components inside the stage 2. For example, the slip ring 83 is electrically connected to a wire that supplies power to the heater 2b built in the stage 2. Further, for example, the slip ring 83 is electrically connected to a wire that applies a voltage to an electrode for electrostatically adsorbing the substrate W onto the stage 2.

The motor 82 rotates the rotary shaft 80. With the rotation of the rotary shaft 80, the stage 2 rotates via the support member 2a. When the rotary shaft 80 rotates, the slip ring 83 also rotates together with the rotary shaft 80, while the electrical connection between the slip ring 83 and the wire is maintained.

The vacuum seal 81 is, for example, a magnetic fluid seal, and is provided around the rotary shaft 80. The vacuum seal 81 may air-tightly seal the rotary shaft 80 and secure smooth rotation of the rotary shaft 80. Further, although not illustrated, a lifting mechanism raises and lowers the support member 2a to raise and lower the stage 2 between a processing position and a delivery position.

A tilt changer 7 is connected to the lower end portion 2d of the support member 2a via the vacuum seal 81. The tilt changer 7 includes an absorption mechanism 70, a bellows 71, a plurality (for example, six) of actuators 72, and a base member 73.

The bellows 71 is provided to surround the periphery of the support member 2*a*. An upper end of the bellows 71 passes through an opening 70*a* formed in the absorption mechanism 70 and is connected to the bottom wall 1*b* of the processing container 1. A lower end of the bellows 71 is connected to the base member 73. As a result, the bellows 71 air-tightly seals a space between the bottom wall 1*b* of the processing container 1 and the base member 73. The bellows 71 is extensible with the movement of the base member 73.

The base member 73 is connected to the lower end portion 2*d* of the support member 2*a* located outside the processing container 1 via the vacuum seal 81 so that the base member 73 can move integrally with the support member 2*a* and the stage 2. An opening 73*a* having a larger diameter than that of the lower end portion 2*d* of the support member 2*a* is formed in the base member 73. The support member 2*a* passes through the opening 73*a*, so that the lower end portion 2*d* of the support member 2*a* is connected to the rotary shaft 80. The vacuum seal 81 is provided around the rotary shaft 80 connected to the lower end portion 2*d* of the support member 2*a*, and the base member 73 is fixed to an upper surface of the vacuum seal 81. As a result, the base member 73 is connected to the stage 2 via the vacuum seal 81, the rotary shaft 80, and the support member 2*a*, and can move integrally with the stage 2.

The plurality of actuators 72 are provided in parallel to each other between the bottom wall 1*b* of the processing container 1 and the base member 73, and are capable of changing the tilt of the stage 2 by changing the tilt of the base member 73 relative to the bottom wall 1*b* of the processing container 1. In addition, the plurality of actuators 72 may change the position of the base member 73 relative to the bottom wall 1*b* of the processing container 1. The plurality of actuators 72, which are extensible, are rotatably and slidably connected to the base member 73 via universal joints and are also rotatably and slidably connected to the side of the bottom wall 1*b* of the processing container 1 via universal joints.

The plurality of actuators 72 and the base member 73 form a parallel link mechanism that enables movement of the base member 73, for example, in directions of the X-axis, the Y-axis, and the Z-axis as illustrated in FIG. 1 and in rotational directions around the X-axis, around the Y-axis, and around the Z-axis. A movement coordinate system of the parallel link mechanism, formed by the plurality of actuators 72 and the base member 73, is adjusted in advance to coincide with a coordinate system of the processing container 1. By interconnecting the bottom wall 1*b* of the processing container 1 and the base member 73 with the parallel link mechanism, the plurality of actuators 72 may move the base member 73 relative to the bottom wall 1*b* of the processing container 1. This makes it possible to adjust the tilt of the stage 2. For example, the plurality of actuators 72 may change the tilt of the stage 2 by tilting the base member 73 in a predetermined direction (for example, in at least one of the rotational directions around the X-axis and around the Y-axis as illustrated in FIG. 1) with respect to the bottom wall 1*b* of the processing container 1.

The opening 70*a* is formed in the absorption mechanism 70 to communicate with the interior of the processing container 1 via the opening 1*c* in the bottom wall 1*b* of the processing container 1. The plurality of actuators 72 are not connected to the bottom wall 1*b* of the processing container 1 but are connected to the absorption mechanism 70. As a result, even if the bottom wall 1*b* of the processing container 1 deforms, the stress due to the deformation of the bottom wall 1*b* of the processing container 1 is absorbed by the absorption mechanism 70. Therefore, the stress due to the deformation of the bottom wall 1*b* of the processing container 1 is not transmitted to the plurality of actuators 72, which may prevent a degradation of the accuracy of the adjustment of the tilt of the stage 2.

The absorption mechanism 70 is provided on the bottom wall 1*b* of the processing container 1 to absorb the deformation of the bottom wall 1*b* of the processing container 1. FIG. 3 is an enlarged cross-sectional view illustrating an example of a structure of the absorption mechanism 70. The absorption mechanism 70 includes a plate member 700 and a link member 701.

The plate member 700 is formed in a plate shape and in an annular shape, and is arranged below the bottom wall 1*b* of the processing container 1. The plate member 700 is spaced apart from the bottom wall 1*b* of the processing container 1 from the viewpoint of preventing the transfer of heat or vibrations from the processing container 1.

The link member 701 has one end rotatably and slidably connected to the bottom wall 1*b* of the processing container 1 and the other end rotatably and slidably connected to the plate member 700. For example, as illustrated in FIG. 3, a concave portion 1*b*1 is formed in the bottom wall 1*b* of the processing chamber 1, and a spherical bearing 1*b*2 is provided in the concave portion 1*b*1. A spherical convex portion 702 is formed at one end of the link member 701. When the convex portion 702 is connected to the spherical bearing 1*b*2, the link member 701 is rotatably and slidably connected to the bottom wall 1*b* of the processing container 1 via the convex portion 702 and the spherical bearing 1*b*2. On the other hand, a concave portion 703 is formed in an upper surface of the plate member 700 at a position corresponding to the concave portion 1*b*1 of the processing container 1. A spherical bearing 704 is provided in the concave portion 703. A spherical convex portion 705 is formed at the other end portion of the link member 701. When the convex portion 705 is connected to the spherical bearing 704, the link member 701 is rotatably and slidably connected to the plate member 700 via the convex portion 705 and the spherical bearing 704.

The link member 701 prevents the deformation of the bottom wall 1*b* of the processing container 1 from being transmitted to the plate member 700 by rotating in the direction corresponding to the deformation. For example, when the bottom wall 1*b* of the processing container 1 deforms in the direction of the arrow in FIG. 3, the link member 701 receives the stress due to the deformation of the bottom wall 1*b*. However, by rotating along with the bottom wall 1*b* in the direction of the arrow in FIG. 1, the link member 701 prevents the stress due to the deformation of the bottom wall 1*b* from being transmitted to the plate member 700. The plurality of actuators 72 are connected to the plate member 700. As a result, no stress due to the deformation of the bottom wall 1*b* of the processing container 1 is transmitted to the plurality of actuators 72 via the plate member 700, which makes it possible to prevent the accuracy of the adjustment of the position or tilt of the stage 2 from being deteriorated.

A plurality of link members 701 are arranged in an extension direction of the plate member 700. In the present embodiment, for example, three link members 701 are provided at substantially regular intervals in the extension direction of the plate member 700. In addition, four or more link members 701 may be provided at substantially regular intervals in the extension direction of the plate member 700.

Further, a distance meter 9 is fixed to the plate member 700. In the present embodiment, the distance meter 9 includes a light emitter and a light receiver. The light emitter emits light (for example, laser light) to an object, and the light receiver receives light reflected from the object. Then, the distance meter 9 measures a distance between the distance meter 9 and the object based on the light emitted from the light emitter and the light received by the light receiver. For example, the distance meter 9 measures the distance between the distance meter 9 and the object based on a difference between a phase of the light emitted from the light emitter and a phase of the light received by the light receiver. In addition, the distance meter 9 may output information such as timing about the emitted light and the received light to a controller 102. The controller 102 may measure the distance between the distance meter 9 and the object based on the information received from the distance meter 9.

In the present embodiment, a plurality of distance meters 9 are fixed to the plate member 700. Since the stress due to the deformation of the bottom wall 1b of the processing container 1 is alleviated by the absorption mechanism 70, the stress due to the deformation of the bottom wall 1b of the processing container 1 is less likely to be transmitted to the plate member 700. Therefore, even if the bottom wall 1b of the processing container 1 deforms, the accuracy of distance measurement by the distance meter 9 can be maintained at a high level.

In the present embodiment, the plate member 700 is provided with three distance meters 9 in the extension direction of the plate member 700. The three distance meters 9 are arranged such that an optical axis La of each laser light is positioned to be spaced apart by a predetermined distance from a line parallel to the Z-axis passing through the center O of the stage 2. The predetermined distance is a distance from the center O of the stage 2 to the center of each through-hole 20 (see FIG. 2). Further, in the present embodiment, three windows 1e are provided in the bottom wall 1b of the processing container 1. Each window 1e is arranged between each distance meter 9 and the shower head 3. Further, in the present embodiment, the plurality of distance meters 9 are arranged at regular intervals along an outer periphery of the stage 2 when viewed from a direction crossing the lower surface of the shower head 3. For example, each distance meter 9 is arranged on the plate member 700 such that an angle formed by line segments connecting the respective distance meters 9 at an intersecting point of a straight line, which passes through the center O of the stage 2 and is parallel to the Z-axis, with a plane parallel to the X-axis and the Y-axis, is 120 degrees. Further, in another embodiment, the plate member 700 may be provided with four or more distance meters 9 in the extension direction of the plate member 700.

With this configuration, when the stage 2 rotates until an angle at which the through-hole 20 is positioned on the optical axis La of the light emitted from the distance meter 9 toward the shower head 3 is established, the laser light emitted from each distance meter 9 passes through the window 1e and the through-hole 20. The laser light having passed through the window 1e and the through-hole 20 is emitted to a position 3f (see FIG. 1) on the lower surface of the shower head 3. Then, the laser light reflected from the position 3f on the lower surface of the shower head 3 passes through the through-hole 20 and the window 1e and is received by the distance meter 9. As a result, each distance meter 9 may measure a first distance between the shower head 3 and the distance meter 9. Further, in the present embodiment, the three distance meters 9 are arranged at regular intervals along the outer periphery of the stage 2 when viewed from the direction crossing the lower surface of the shower head 3. As a result, when the stage 2 rotates until the angle at which the through-hole 20 is positioned on the optical axis La of the light emitted from the distance meter 9 toward the shower head 3 is established, the laser light emitted from each distance meter 9 passes through the window 1e and the through-hole 20 at the same time. Therefore, the plurality of distance meters 9 can measure the first distance at the same time, which makes it possible to reduce the time required to measure the first distance by the plurality of distance meters 9. In addition, the position 3f on the lower surface of the shower head 3 to which the laser light is emitted may be a flat surface. The position 3f on the lower surface of the shower head 3 is an example of a measurement position.

On the other hand, when the stage 2 rotates until an angle at which the stage 2 blocks the optical path of the laser light emitted from the distance meter 9 toward the shower head 3 is established, the laser emitted from each distance meter 9 passes through the window 1e and is emitted onto the lower surface of the stage 2. Then, the laser light reflected from the lower surface of the stage 2 passes through the window 1e, and is received by the distance meter 9. As a result, each distance meter 9 can measure a second distance between the lower surface of the stage 2 and the distance meter 9.

However, in the vacuum processing apparatus 100, when an internal pressure of the processing container 1 is controlled to a pressure lower than atmospheric pressure, the processing container 1 deforms due to a pressure difference between the internal pressure and an external pressure of the processing container 1. Further, a temperature of the processing container 1 changes by a temperature control performed on the processing container 1 or heat generated by a substrate processing performed inside the processing container 1. When the temperature of the processing container 1 changes, the processing container 1 also deforms. When the processing container 1 deforms, the stress due to the deformation of the processing container 1 may be transmitted to the stage 2, which may cause the stage 2 to tilt with respect to the shower head 3. In order to enhance the uniformity of a processing for the substrate W, it is necessary to enhance the uniformity of gas distribution, gas flow, RF power distribution, and the like inside the processing container 1. One crucial factor for achieving this is to keep the shower head 3 and the stage 2 parallel to each other. However, when the processing container 1 deforms, the stage 2 may tilt with respect to the shower head 3, which may cause uneven gas distribution and the like inside the processing container 1.

Therefore, in the vacuum processing apparatus 100 according to the present embodiment, the plurality of actuators 72 are provided between the bottom wall 1b of the processing container 1 and the base member 73 which is movable integrally with the stage 2. The plurality of actuators 72 move the base member 73 relative to the bottom wall 1b, thereby adjusting the tilt of the stage 2 with respect to the shower head 3. As a result, even if the stage 2 tilts with respect to the shower head 3 due to the deformation of the processing container, it is possible to adjust the tilt of the stage 2 such that the stage 2 is in parallel to the shower head 3. As a result, the vacuum processing apparatus 100 according to the present embodiment can suppress the tilt of the stage 2 with respect to the shower head 3 due to the deformation of the processing container 1, which makes it possible to enhance the in-plane uniformity of a substrate processing such as a film formation processing.

An exhaust port 40 is formed in the bottom wall 1b of the processing container 1. An exhaust device 42 is connected to the exhaust port 40 via a pipe 41. The exhaust device 42 includes a vacuum pump, a pressure regulating valve, and the like. The interior of the processing container 1 may be evacuated to a predetermined vacuum level by the exhaust device 42.

The controller 102 includes a memory, a processor, and an input/output interface. The memory stores programs executed by the processor, recipes including conditions for each processing, and the like. The processor executes the programs read from the memory and controls each part of a main body 101 via the input/output interface based on the recipes stored in the memory.

[Tilt Adjustment Method]

Figure 4:
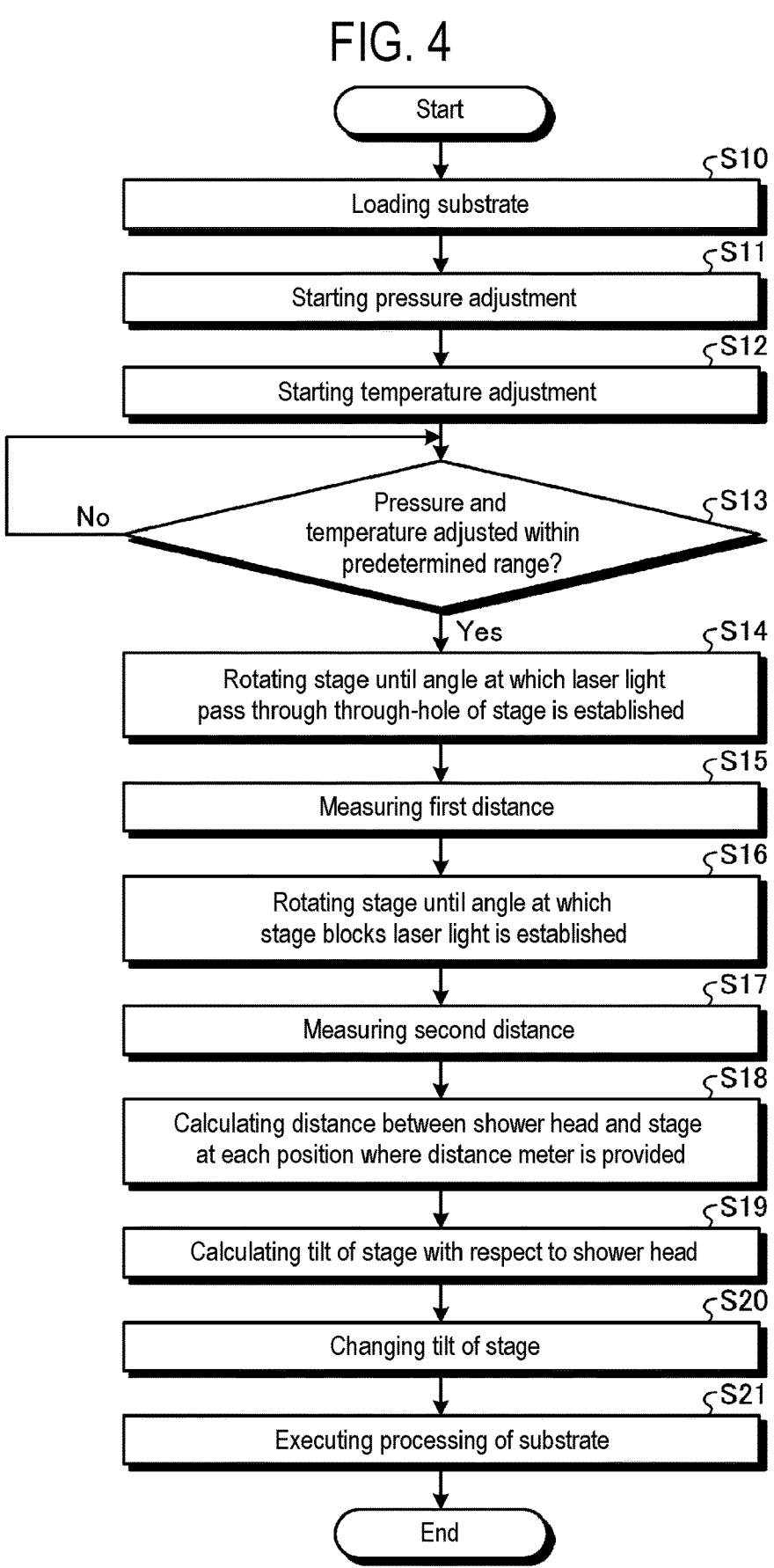
FIG. 4 is a flowchart illustrating an example of a tilt adjustment method according to one embodiment.

FIG. 4 is a flowchart illustrating an example of a tilt adjustment method according to one embodiment. Each step illustrated in FIG. 4 is implemented by the controller 102 that controls each part of the main body 101.

First, the substrate W is loaded into the processing container 1 (S10). In step S10, the gate valve G is opened, and the substrate W is loaded into the processing container 1 via the opening 1a by a transfer device (not illustrated) and is placed on the stage 2. Then, the gate valve G is closed, and the substrate W is electrostatically adsorbed and held on the upper surface of the stage 2.

Subsequently, the adjustment of the internal pressure of the processing container 1 is started (S11). In step S11, a gas is supplied into the processing container 1 from the gas supplier 35 via the shower head 3, the gas inside the processing container 1 is discharged by the exhaust device 42, and the internal pressure of the processing container 1 is adjusted to a predetermined pressure by the pressure regulating valve in the exhaust device 42. The predetermined pressure is, for example, a pressure when processing the substrate W.

Subsequently, the adjustment of the temperature of the substrate W is started (S12). In step S12, power is supplied to the heater 2b built in the stage 2 to heat the substrate W. Further, when a temperature-controlled coolant is supplied to the flow path formed inside the stage 2 by the chiller unit, the stage 2 is cooled, and the substrate W is cooled by the stage 2. Through the heating by the heater 2b and the cooling by the coolant, the temperature of the substrate W is adjusted to a predetermined temperature. The predetermined temperature is, for example, a temperature when processing the substrate W. In addition, the order of step S11 and step S12 may be reversed, and step S11 and step S12 may progress simultaneously.

Subsequently, the controller 102 determines whether or not the internal pressure of the processing container 1 is adjusted to a pressure within a predetermined range and the temperature of the substrate W is adjusted to a temperature within a predetermined range (S13). When the internal pressure of the processing container 1 has not been adjusted to the pressure within the predetermined range or when the temperature of the substrate W has not been adjusted to the temperature within the predetermined range ("NO" in S13), the controller 102 again executes the processing illustrated in step S13.

Figures 5, 6:
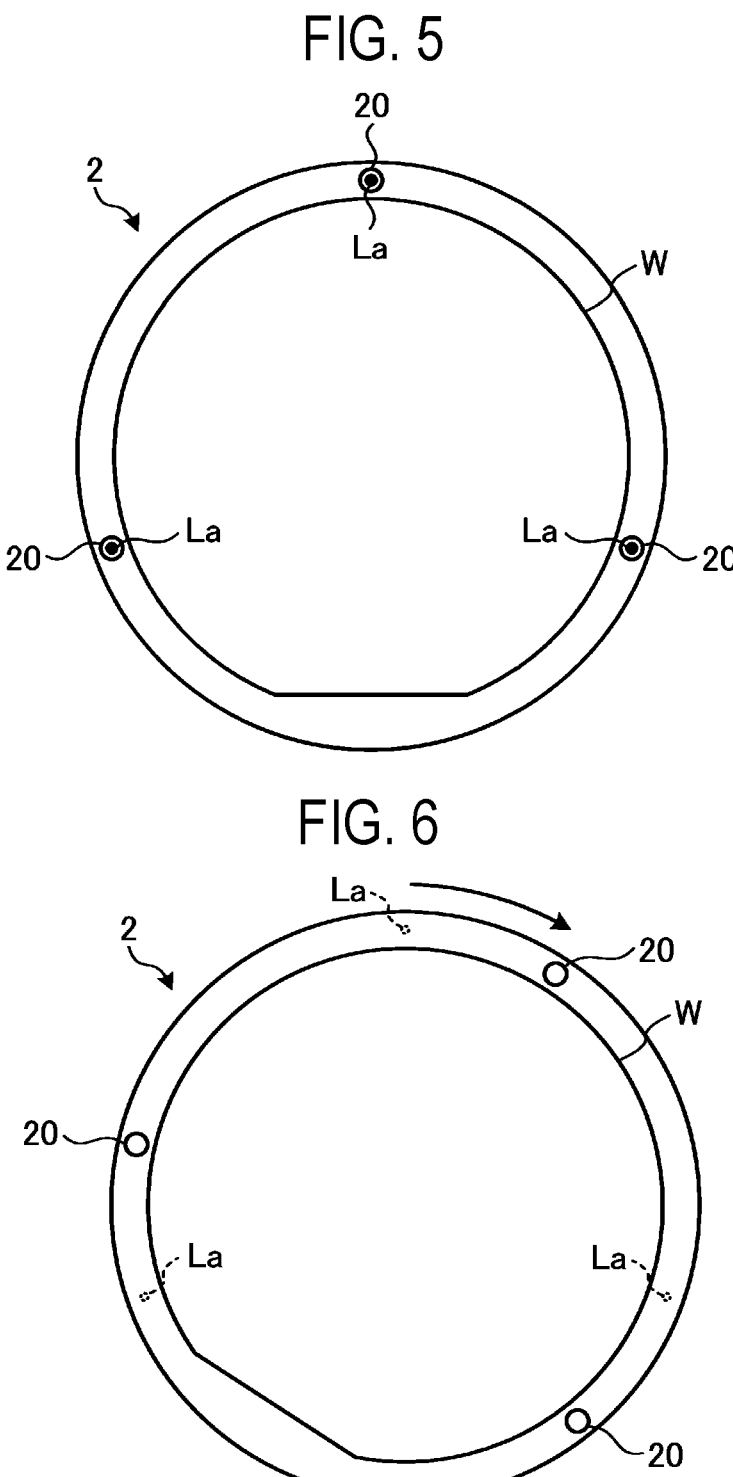
FIG. 5 is a plan view illustrating an example of the stage at an angle at which an optical axis of laser light passes through a through-hole of the stage.
FIG. 6 is a plan view illustrating an example of the stage at an angle to block the laser light.

On the other hand, when the internal pressure of the processing container 1 has been adjusted to the pressure within the predetermined range and the temperature of the substrate W has been adjusted to the temperature within the predetermined range ("YES" in S13), the controller 102 controls the rotator 8 as follows. That is, the controller 102 controls the rotator 8 to rotate the stage 2 until the angle at which the through-hole 20 of the stage 2 is aligned in position with the optical axis La of the laser light emitted from the distance meter 9 toward the shower head 3 is established such that the light passes through the through-hole 20 (S14). Step S14 is an example of a first rotation operation. Thus, as illustrated in FIGS. 1 and 5, for example, the optical axis La of the laser light emitted from each distance meter 9 passes through the through-hole 20, and is emitted to the position 3f on the lower surface of shower head 3. Then, the laser light reflected from the position 3f on the lower surface of the shower head 3 passes through the through-hole 20 and is received by the distance meter 9.

In the present embodiment, for example, as illustrated in FIG. 2, each through-hole 20 is provided on the side of the outer periphery of the stage 2 outside the area 2e on the stage 2 on which the substrate W is placed. Therefore, even in the state where the substrate W is placed on the stage 2, the laser light emitted from each distance meter 9 may pass through the through-hole 20.

Subsequently, the distance meter 9 measures the first distance between the distance meter 9 and the shower head 3 based on the laser light emitted to the shower head 3 and the reflected light received from the shower head 3 (S15). Step S15 is an example of a first measurement operation. Information about the first distance measured by each distance meter 9 is output to the controller 102.

Figure 7:
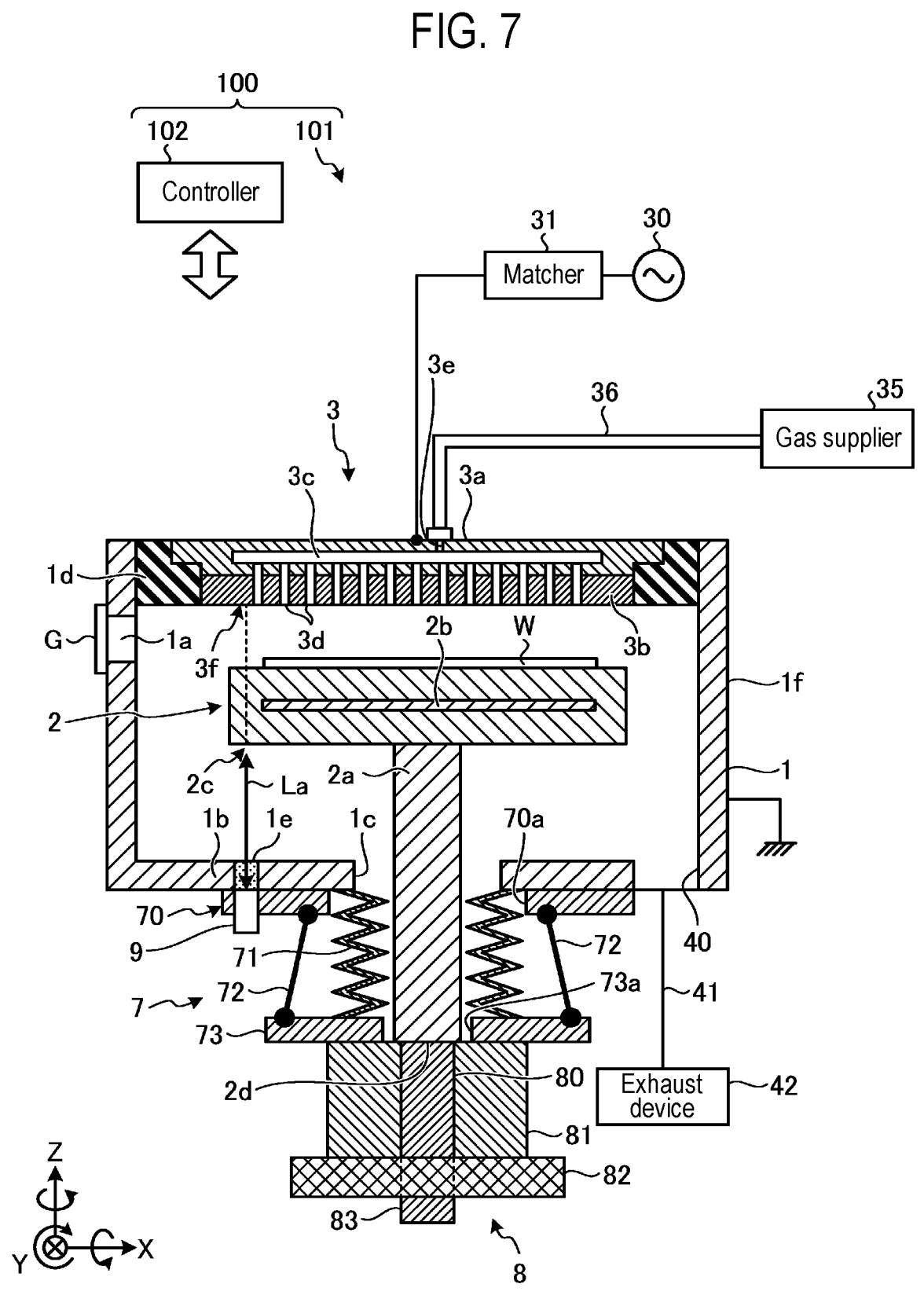

Subsequently, the controller 102 controls the rotator 8 to rotate the stage 2 until the angle at which the stage 2 blocks the laser light emitted from the distance meter 9 to the shower head 3 is established (S16). Step S16 is an example of a second rotation operation. Thus, for example, as illustrated in FIGS. 6 and 7, the laser light emitted from each distance meter 9 toward the shower head 3 is blocked by the stage 2. Therefore, the laser light emitted from each distance meter 9 is reflected at a position 2c on the lower surface of the stage 2 and is received by the distance meter 9.

Subsequently, the distance meter 9 measures the second distance between the distance meter 9 and the lower surface of the stage 2 based on the laser light emitted to the stage 2 and the reflected light received from the stage 2 (S17). Step S17 is an example of a second measurement operation. The second distance measured by each distance meter 9 is output to the controller 102. In addition, the order of a series of flows of steps S14 and S15 and a series of flows of steps S16 and S17 may be reversed.

Subsequently, the controller 102 calculates the distance between the lower surface of the shower head 3 and the lower surface of the stage 2 at each position where the distance meter 9 is provided, based on the first distance and the second distance measured by each distance meter 9 (S18). Three distance meters 9 are provided below the stage 2. Therefore, in step S18, the distance between the lower surface of the shower head 3 and the lower surface of the stage 2 is calculated at three positions where the distance meters 9 are provided.

Subsequently, the controller 102 calculates the tilt of the lower surface of the stage 2 with respect to the lower surface of the shower head 3 (S19). In the present embodiment, since the distance between the lower surface of the shower head 3 and the lower surface of the stage 2 is calculated at the three positions where the distance meters 9 are provided, the tilt of the lower surface of the stage 2 relative to the lower surface of the shower head 3 can be calculated.

Here, when processing the substrate W, the internal pressure of the processing container 1 is controlled to a pressure lower than atmospheric pressure. When the internal pressure of the processing container 1 is controlled to the pressure lower than the atmospheric pressure, the processing container 1 may deform due to a pressure difference between the internal pressure and an external pressure of the processing container 1. Further, when processing the substrate W, a temperature of a member of the processing chamber 1 may be controlled to a temperature different from an ambient temperature depending on processing conditions. When the temperature of the member of the processing container 1 is controlled to the temperature different from the ambient temperature, the temperature of the member is radiated to the processing container 1, causing a change in the temperature of the processing container 1. The processing container 1 may deform when the temperature of the processing container 1 changes.

In the present embodiment, after it is determined in step S13 that the internal pressure of the processing container 1 has been adjusted to the pressure within the predetermined range and that the temperature of the substrate W has been adjusted to the temperature within the predetermined range, each distance meter 9 measures the first distance and the second distance. In the present embodiment, the pressure within the predetermined range is, for example, the pressure when processing the substrate W. Further, in the present embodiment, the temperature within the predetermined range is, for example, the temperature when processing the substrate W. In the present embodiment, the first distance and the second distance are measured after completion of the adjustment to the pressure and temperature when processing the substrate W. Then, the tilt of the lower surface of the stage 2 relative to the lower surface of the shower head 3 is calculated based on the measured first and second distances. As a result, the tilt of the lower surface of the stage 2 relative to the lower surface of the shower head 3 in an environment where the substrate W is actually processed can be calculated.

Returning back to FIG. 4, the description will be continued. The controller 102 changes the tilt of the stage 2 so as to make the lower surface of the stage 2 parallel to the lower surface of the shower head 3 based on the tilt calculated in step S19 (S20). Step S20 is an example of a change operation. In step S20, the controller 102 calculates a tilt of the stage 2 that compensates for the tilt calculated in step S19. Then, the controller 102 controls the tilt changer 7 such that the stage 2 is positioned at the calculated tilt. As a result, the lower surface of the shower head 3 and the substrate W placed on the stage 2 can be positioned to be parallel to each other.

After the change of the tilt of the stage 2 in step S20 is completed, a processing on the substrate W is executed (S21). Then, the tilt adjustment method illustrated in this flowchart ends.

In the above, one embodiment has been described. The vacuum processing apparatus 100 of the present embodiment includes the processing container 1, the stage 2, the support member 2a, the tilt changer 7, the distance meter 9, and the controller 102. The processing container 1 has the top wall, the bottom wall 1b, and the sidewall 1f, and is capable of maintaining the interior thereof in the vacuum atmosphere. The stage 2 is provided inside the processing container 1, and the substrate W is placed on the stage 2. Further, the stage 2 holds the substrate W so as to face the top wall. The support member 2a penetrates the bottom wall 1b of the processing container 1 and supports the stage 2 from below. The tilt changer 7 is provided on the lower end portion 2d of the support member 2a located outside the processing container 1 and changes the tilt of the stage 2 relative to the top wall of the processing container 1. The distance meter 9 measures the distance between the top wall and the stage 2 at the position 3f on the surface of the top wall facing the stage 2. The controller 102 controls the tilt changer 7 so as to make the stage 2 and the top wall parallel to each other, based on the distance between the top wall and the stage 2, which is measured by the distance meter 9. Thus, it is possible to suppress the tilt of the stage 2 relative to the top wall of the processing container 1.

Further, in the above-described embodiment, the distance meter 9 is provided so as to correspond to one of three or more positions 3f on the surface of the top wall. Further, the controller 102 controls the tilt changer 7 so as to make the stage 2 and the top wall parallel to each other, based on the distance between the top wall and the stage 2, which is measured by each distance meter 9. Thus, it is possible to more precisely suppress the tilt of the stage 2 relative to the top wall of the processing container 1.

Further, the vacuum processing apparatus 100 in the above-described embodiment includes the rotator 8 that rotates the stage 2. The distance meter 9 is provided below the stage 2, emits light toward each position 3f and measures the distance between the distance meter 9 and an object on the optical axis of the emitted light based on the emitted light and the received light reflected from the object. The through-hole 20 is formed in the stage 2. The controller 102 controls the distance meter 9 to measure the first distance from the distance meter 9 to the top wall after controlling the rotator 8 to rotate the stage 2 until the angle at which the through-hole 20 of the stage 2 is aligned in position with the light emitted along the optical axis is established such that the light passes through the through-hole 20. Further, the controller 102 controls the distance meter 9 to measure the second distance from the distance meter 9 to the lower surface of the stage 2 after controlling the rotator 8 to rotate the stage 2 until the angle at which the stage 2 blocks the light emitted along the optical axis is established. Further, the controller 102 calculates the distance between the top wall and the stage 2 based on a difference between the first distance and the second distance. Thus, it is possible to calculate the tilt of the stage 2 relative to the top wall of the processing container 1.

Further, in the above-described embodiment, the plurality of distance meters 9 are arranged at regular intervals along the outer periphery of the stage 2 when viewed from the direction crossing the surface of the top wall. Thus, it is possible to more precisely calculate the tilt of the stage 2 relative to the top wall of the processing container 1.

Further, in the above-described embodiment, the through-hole 20 is formed in an area outside the area of the stage 2 on which the substrate W is placed. Thus, it is possible to ensure that the light emitted from each distance meter 9 passes through the through-hole 20 even in the state in which the substrate W is placed on the stage 2.

Further, in the above-described embodiment, the number of through-holes 20 is the same as the number of distance meters 9. The plurality of through-holes 20 are arranged at regular intervals along the outer periphery of the stage 2. Thus, the plurality of distance meters 9 can measure the first distance at the same time, which makes it possible to the time required to measure the first distance by the plurality of distance meters 9.

Further, in the above-described embodiment, the plate member 700 is connected to the bottom wall 1b of the processing container 1 via the link member 701 that absorbs the deformation of the bottom wall 1b. The tilt changer 7 changes the tilt of the stage 2 with reference to the plate member 700. The distance meter 9 is fixed to the plate member 700. Thus, it is possible to maintain the high accuracy of distance measurement by the distance meter 9 even if the bottom wall 1b of the processing container 1 deforms.

Further, in the above-described embodiment, the controller 102 controls the distance meter 9 to measure the distance between the top wall and the stage 2 after the substrate W is placed on the stage 2, the internal pressure of the processing container 1 is adjusted to the pressure used for the processing on the substrate W, and the temperature of the substrate W is adjusted to the temperature used for the processing on the substrate W. Thus, it is possible to measure the distance between the top wall and the stage 2 in an environment where the substrate W is actually processed. This makes it possible to calculate the tilt of the stage 2 relative to the top wall in the environment where the substrate W is actually processed.

Further, the tilt adjustment method in the above-described embodiment includes the first rotation operation, the first measurement operation, the second rotation operation, the second measurement operation, and the change operation. In the first rotation operation, the stage 2 is rotated until the angle at which the through-hole 20 formed in the stage 2 on which the substrate W is placed is aligned in position with the light emitted along the optical axis from the distance meter 9 provided below the stage 2 is established such that the light passes through the through-hole 20. In the first measurement operation, the first distance between the distance meter 9 and the top wall is measured based on the light emitted from the distance meter 9 to the top wall of the processing container 1 along the optical axis and the light received by the distance meter 9. In the second rotation operation, the stage 2 is rotated until the angle at which the stage 2 blocks the light emitted from the distance meter 9 along the optical axis is established. In the second measurement operation, the second distance between the distance meter 9 and the lower surface of the stage 2 is measured based on the light emitted from the distance meter 9 along the optical axis and the light received by the distance meter 9. In the change operation, the distance between the top wall and the stage 2 is calculated based on the difference between the first distance and the second distance, and the tilt of the stage 2 relative to the top wall is changed based on the calculated distance such that the stage is in parallel to the top wall. Thus, it is possible to suppress the tilt of the stage 2 with respect to the top wall of the processing container 1.

OTHERS

In addition, the technique disclosed herein is not limited to the above-described embodiment, and various modifications are possible within the scope of the gist thereof.

Figures 8, 9:
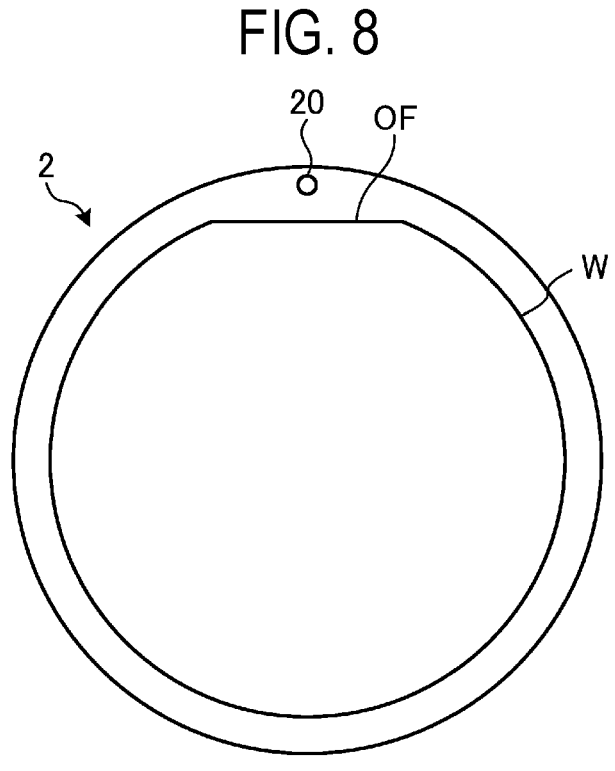
FIG. 8 is a plan view illustrating another example of the stage.
FIG. 9 is a plan view illustrating still another example of the stage.

For example, in the above-described embodiment, the plurality of through-holes 20 are formed in the stage 2 along the outer periphery of the stage 2, but the technique of the disclosure is not limited thereto. Alternatively, for example, the stage 2 may be provided with one through-hole 20 as illustrated in FIG. 8. Even with this configuration, with the rotation of the stage 2, the laser light emitted from each distance meter 9 toward the shower head 3 can pass through the through-hole 20. Further, with the rotation of the stage 2, the laser light emitted from each distance meter 9 toward the shower head 3 can be blocked by the stage 2. In addition, in the case where one through-hole 20 is formed in the stage 2, for example, as illustrated in FIG. 8, the through-hole 20 may be formed near a position where a reference shape OF, which indicates an orientation of the substrate W, is placed. Thus, it is possible to reduce the influence of the through-hole 20 in the stage 2 on the uniformity of the processing on the substrate W.

Further, in the above-described embodiment, the plurality of through-holes 20 are formed in the stage 2 along the outer periphery of the stage 2, but the technique of the disclosure is not limited thereto. Alternatively, for example, as illustrated in FIG. 9, a plurality of convex portions 2f and a plurality of concave portions 2g may be formed along the outer periphery of the stage 2. In the example of FIG. 9, three convex portions 2f and three concave portions 2g are formed along the outer periphery of the stage 2. Further, in the example of FIG. 9, the three concave portions 2g are arranged at regular intervals along the outer periphery of the stage 2. The concave portions 2g are arranged such that the angle formed by line segments connecting the center O of the stage 2 and the concave portions 2g is, for example, 120 degrees. In addition, in the example of FIG. 9, a lower surface of the convex portion 2f is formed parallel to the upper surface of the stage 2 on which the substrate W is placed. Even with this configuration, with the rotation of the stage 2, the laser light emitted from each distance meter 9 toward the shower head 3 can pass through the concave portion 2g. Further, with the rotation of the stage 2, the convex portion 2f can block the laser light emitted from each distance meter 9 toward the shower head 3. In addition, in the example of FIG. 9, one concave portion 2g may be formed near the position where the reference shape OF indicating the orientation of the substrate W is arranged, similarly to FIG. 8.

Figure 10:
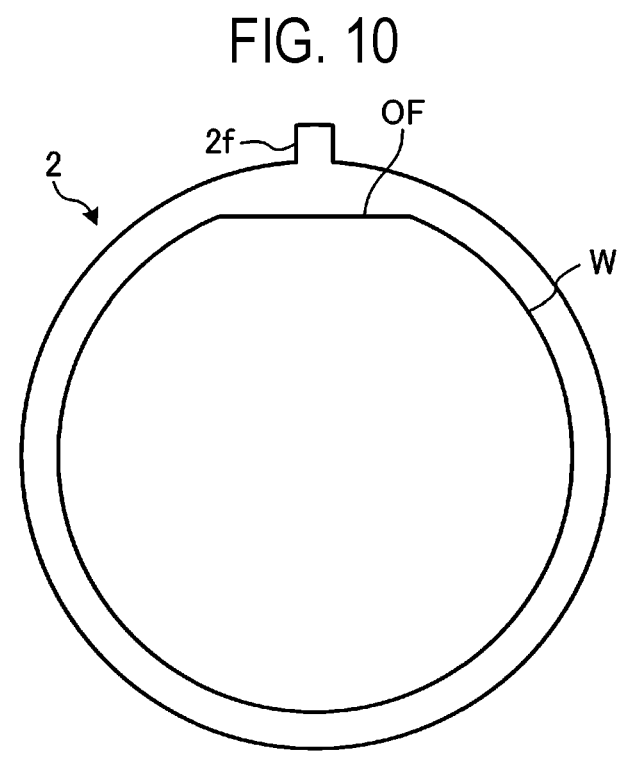

Further, in the above-described embodiment, the plurality of through-holes 20 are formed in the stage 2 along the outer periphery of the stage 2, but the technique of the disclosure is not limited thereto. Alternatively, for example, as illustrated in FIG. 10, one convex portion 2f may be formed on the outer periphery of the stage 2 to protrude from the outer periphery of the stage 2 in a direction away from the stage 2. In addition, in the example of FIG. 10, a lower surface of the convex portion 2f is formed parallel to the upper surface of the stage 2 on which the substrate W is placed. Even with this configuration, by rotating the stage 2 until the angle at which the convex portion 2f does not block the laser light emitted from the distance meter 9 toward the shower head 3 is established, it is possible to emit the laser light from each distance meter 9 to the shower head 3. Further, by rotating the stage 2 until the angle at which the convex portion 2f blocks the laser light emitted from the distance meter 9 toward the shower head 3 is established, it is possible to reflect the laser light emitted from each distance meter 9 to the shower head 3 by the lower surface of the convex portion 2f. In addition, in the example of FIG. 10, a plurality of convex portions 2f may be formed along the outer periphery of the stage 2, similarly to the convex portions 2f in FIG. 9.

Further, in the above-described embodiment, the distance meter 9 measures the first distance and the second distance using the laser light, but the technique of the disclosure is not limited thereto. The distance meter 9 may measure the first distance and the second distance using light other than the laser light, or may measure the first distance and the second distance using other electromagnetic waves such as millimeter waves.

Further, when a processing such as film formation on the substrate W is repeated, reaction by-products (so-called deposits) adhere to the interior of the processing container 1 such as the lower surface of the shower head 3. When such deposits adhere to the lower surface of the shower head 3, the accuracy of the measurement of the distance between the distance meter 9 and the lower surface of the shower head 3 may be degraded. Therefore, it is desirable to perform the measurement of the first distance and the second distance by the distance meter 9 after cleaning is executed to remove the deposits inside the processing container 1 and before the processing on the substrate W is started. Thus, it is possible to more precisely measure the first distance and the second distance.

Further, the first distance measured before the processing on the substrate W is executed may be stored as a reference value, and the first distance may be re-measured every time a predetermined number of processing on the substrate W is completed. Then, a thickness of the deposits adhering to the lower surface of the shower head 3 may be estimated based on the measured first distance and the reference value. Thus, it is possible to determine the timing of cleaning the interior of the processing container 1 based on the actual thickness of the deposits.

Further, in the above-described embodiment, each distance meter 9 measures the first distance and the second distance, but the technique of the disclosure is not limited thereto. Alternatively, the distance meter 9 for measuring the first distance and the distance meter 9 for measuring the second distance may be separately provided on the plate member 700. In this case, the distance meter 9 for measuring the first distance emits the laser light toward the lower surface of the shower head 3 from the position where the laser light is not always blocked by the stage 2, and the distance meter 9 for measuring the second distance always emits the laser light toward the lower surface of the stage 2. Thus, since the first distance and the second distance can be measured without rotating the stage 2, it is possible to reduce the time required to measure the distance between the shower head 3 and the stage 2.

Further, in the above-described embodiment, the processing container 1 includes the shower head 3 as an example of the top wall, but the technique of the disclosure is not limited thereto. For example, the top wall of the processing container 1 may be an electrode or a wall surface having no gas discharge hole 3*d*.

Further, in the above-described embodiment, the vacuum processing apparatus 100 that processes the substrate W using capacitive coupled plasma (CCP) has been described as an example of a plasma source, but the plasma source is not limited thereto. Examples of the plasma source other than the capacitive coupling plasma may include inductively coupled plasma (ICP), microwave excited surface wave plasma (SWP), electron cyclotron resonance plasma (ECP), and helicon wave excited plasma (HWP) and the like.

Further, in the above-described embodiment, the vacuum processing apparatus 100 that performs film formation has been described as an example, but the technique of the disclosure is not limited thereto. That is, the technique of the disclosure may be applied to other vacuum processing apparatuses such as an etching apparatus, a heating apparatus and the like as long as they are vacuum processing apparatuses that process the substrate W under a depressurized environment.

In addition, the embodiments disclosed herein should be considered to be exemplary and not limitative in all respects. Indeed, the above-described embodiments may be implemented in various forms. Further, the above-described embodiments may be omitted, replaced or modified in various forms without departing from the scope of the appended claims and their gist.

EXPLANATION OF REFERENCE NUMERALS

G: gate valve, La: optical axis, O: center, OF: reference shape, W: substrate, 100: vacuum processing apparatus, 101: main body, 102: controller, 1: processing container, 1*a*: opening, 1*b*: bottom wall, 1*b*1: concave portion, 1*b*2: spherical bearing, 1*c*: opening, 1*d*: insulating member, 1*e*: window, 1*f*: sidewall, 2: stage, 2*a*: support member, 2*b*: heater, 2*c*: position, 2*d*: lower end portion, 2*e*: area, 2*f*: convex portion, 2*g*: concave portion, 20: through-hole, 3: shower head, 3*a*: ceiling plate, 3*b*: shower plate, 3*c*: gas diffusion chamber, 3*d*: gas discharge hole, 3*e*: gas inlet, 3*f*: position, 30: RF power supply, 31: matcher, 35: gas supplier, 36: pipe, 40: exhaust port, 41: pipe, 42: exhaust device, 7: tilt changer, 70: absorption mechanism, 70*a*: opening, 71: bellows, 72: actuator, 73: base member, 73*a*: opening, 700: plate member, 701: link member, 702: convex portion, 703: concave portion, 704: spherical bearing, 705: convex portion, 8: rotator, 80: rotary shaft, 81: vacuum seal, 82: motor, 83: slip ring, 9: distance meter

What is claimed is:

1. A vacuum processing apparatus comprising:
   a processing container having a top wall, a bottom wall, a sidewall, and an interior that is kept in a vacuum atmosphere;
   a stage provided inside the processing container and configured to hold a substrate placed on the stage so as to face the top wall;
   a support member penetrating the bottom wall of the processing container to support the stage from below;
   a tilt changer provided at an end portion of the support member located outside the processing container and configured to change a tilt of the stage with respect to the top wall of the processing container;
   at least one distance meter configured to measure a distance between the top wall and the stage at a measurement position on a surface of the top wall facing the stage;
   a controller configured to control the tilt changer so as to make the top wall and the stage parallel to each other based on the distance between the top wall and the stage as measured by the at least one distance meter; and
   a rotator configured to rotate the stage,
   wherein the at least one distance meter is provided below the stage and is configured to emit light toward the measurement position and to measure a distance between the at least one distance meter and an object on an optical axis of the light based on the emitted light and received light reflected from the object, and
   wherein the stage has a through-hole formed in the stage.

2. The vacuum processing apparatus of claim 1, wherein the at least one distance meter includes three or more distance meters provided so as to correspond to three or more measurement positions, respectively, and
   wherein the controller is configured to control the tilt changer so as to make the top wall and the stage parallel to each other based on the distance between the top wall and the stage as measured by each of the three or more distance meters.

3. The vacuum processing apparatus of claim 2,
   wherein the controller is configured to:
   control the rotator to rotate the stage until an angle at which the through-hole of the stage is aligned in position with the light emitted along the optical axis is established such that the light passes through the through-hole, and subsequently, instruct the at least one distance meter to measure a first distance between the at least one distance meter and the top wall;

control the rotator to rotate the stage until an angle at which the stage blocks the light emitted along the optical axis is established, and subsequently, instruct the at least one distance meter to measure a second distance between the at least one distance meter and a lower surface of the stage, and calculate the distance between the top wall and the stage based on a difference between the first distance and the second distance.

4. The vacuum processing apparatus of claim 3, wherein the through-hole is formed in an area outside an area of the stage on which the substrate is placed.

5. The vacuum processing apparatus of claim 4, wherein the at least one distance meter includes three or more distance meters provided so as to correspond three or more measurement positions, respectively, and wherein the three or more distance meters are arranged at regular intervals along an outer periphery of the stage when viewed from a direction crossing the surface of the top wall.

6. The vacuum processing apparatus of claim 5, wherein the through-hole is a plurality of through-holes that are provided so as to correspond to the three or more distance meters, and wherein the plurality of through-holes are arranged at regular intervals along the outer periphery of the stage.

7. The vacuum processing apparatus of claim 6, wherein the bottom wall of the processing container is connected to a plate member via a link member that absorbs a deformation of the bottom wall, wherein the tilt changer is configured to change the tilt of the stage with reference to the plate member, and wherein the at least one distance meter is fixed to the plate member.

8. The vacuum processing apparatus of claim 7, wherein the controller is configured to control the at least one distance meter to measure the distance between the top wall and the stage after the substrate is placed on the stage, an internal pressure of the processing container is adjusted to a pressure used for a processing on the substrate, and a temperature of the substrate is adjusted to a temperature used for the processing on the substrate.

9. The vacuum processing apparatus of claim 8, wherein the controller is configured to control the at least one distance meter to measure the distance between the top wall and the stage at each of the measurement positions after a cleaning on the interior of the processing container is executed.

10. The vacuum processing apparatus of claim 3, wherein the at least one distance meter includes three or more distance meters provided so as to correspond three or more measurement positions, respectively, and wherein the three or more distance meters are arranged at regular intervals along an outer periphery of the stage when viewed from a direction crossing the surface of the top wall.

11. The vacuum processing apparatus of claim 1, further comprising: a rotator configured to rotate the stage, wherein the at least one distance meter is provided below the stage and is configured to emit light toward the measurement position and to measure a distance between the at least one distance meter and an object on an optical axis of the light based on the emitted light and received light reflected from the object, wherein the stage has a through-hole formed in the stage, and wherein the controller is configured to:

control the rotator to rotate the stage until an angle at which the through-hole of the stage is aligned in position with the light emitted along the optical axis is established such that the light passes through the through-hole, and subsequently, instruct the at least one distance meter to measure a first distance between the at least one distance meter and the top wall;

control the rotator to rotate the stage until an angle at which the stage blocks the light emitted along the optical axis is established, and subsequently, instruct the at least one distance meter to measure a second distance between the at least one distance meter and a lower surface of the stage, and calculate the distance between the top wall and the stage based on a difference between the first distance and the second distance.

12. The vacuum processing apparatus of claim 1, wherein the bottom wall of the processing container is connected to a plate member via a link member that absorbs a deformation of the bottom wall, wherein the tilt changer is configured to change the tilt of the stage with reference to the plate member, and wherein the at least one distance meter is fixed to the plate member.

13. The vacuum processing apparatus of claim 1, wherein the controller is configured to control the at least one distance meter to measure the distance between the top wall and the stage after the substrate is placed on the stage, an internal pressure of the processing container is adjusted to a pressure used for a processing on the substrate, and a temperature of the substrate is adjusted to a temperature used for the processing on the substrate.

14. The vacuum processing apparatus of claim 1, wherein the controller is configured to control the at least one distance meter to measure the distance between the top wall and the stage at each of the measurement positions after a cleaning on the interior of the processing container is executed.

15. A tilt adjustment method comprising:

a first rotation operation of rotating a stage on which a substrate is placed until an angle at which a through-hole formed in the stage is aligned in position with light emitted from a distance meter provided below the stage along an optical axis is established such that the light passes through the through-hole;

a first measurement operation of measuring a first distance between the distance meter and a top wall of a processing container based on the light emitted from the distance meter to the top wall along the optical axis and light received by the distance meter;

a second rotation operation of rotating the stage until an angle at which the stage blocks the light emitted from the distance meter along the optical axis is established;

a second measurement operation of measuring a second distance between the distance meter and a lower surface of the stage based on the light emitted from the distance meter along the optical axis and the light received by the distance meter; and a change operation of calculating a distance between the top wall and the stage based on a difference between the first distance and the second distance, and changing a tilt of the stage with respect to the top wall so as to make the top wall and the stage parallel to each other based on the calculated distance.

\* \* \* \* \*